US012768033B2

(12) United States Patent
Mattinen et al.

(10) Patent No.: US 12,768,033 B2
(45) **Date of Patent: *Oct. 20, 2026**

(54) DEPOSITION OF TRANSITION METAL-COMPRISING MATERIAL

(71) Applicant: ASM IP Holding B.V., Almere (NL)

(72) Inventors: Miika Mattinen, Eindhoven (NL); Timo Hatanpää, Espoo (FI); Mikko Ritala, Espoo (FI); Markku Leskelä, Espoo (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/987,577

(22) Filed: Dec. 19, 2024

(65) Prior Publication Data

US 2025/0122612 A1 Apr. 17, 2025

Related U.S. Application Data

(63) Continuation of application No. 17/666,903, filed on Feb. 8, 2022, now Pat. No. 12,209,305.

(60) Provisional application No. 63/148,241, filed on Feb. 11, 2021.

(51) Int. Cl.
*C23C 16/00* (2006.01)
*C23C 16/08* (2006.01)
*C23C 16/18* (2006.01)

(52) U.S. Cl.
CPC .............. *C23C 16/18* (2013.01); *C23C 16/08* (2013.01)

(58) Field of Classification Search
CPC ...................................................... C23C 16/00
See application file for complete search history.

(56) References Cited

U.S. PATENT DOCUMENTS

| | | | | |
|---|---|---|---|---|
| 8,298,616 | B2 | 10/2012 | Dussarrat et al. | |
| 10,847,366 | B2 | 11/2020 | Mattinen et al. | |
| 11,476,117 | B2 | 10/2022 | Byun et al. | |
| 11,499,222 | B2 | 11/2022 | Vayrynen et al. | |
| 11,965,238 | B2 | 4/2024 | Illiberi et al. | |
| 2015/0162214 | A1 | 6/2015 | Thompson et al. | |
| 2019/0249300 | A1 | 8/2019 | Hatanpaa et al. | |
| 2019/0279900 | A1 | 9/2019 | Mullick et al. | |
| 2021/0020438 | A1* | 1/2021 | Byun | C23C 16/305 |

FOREIGN PATENT DOCUMENTS

| | | | | |
|---|---|---|---|---|
| WO | 2020003000 | A1 | 1/2020 | |
| WO | WO-2020002995 | A1 * | 1/2020 | G11B 5/85 |

* cited by examiner

*Primary Examiner* — Gordon Baldwin
*Assistant Examiner* — Mohammad Mayy
(74) *Attorney, Agent, or Firm* — Snell & Wilmer L.L.P.

(57) ABSTRACT

The current disclosure relates to the manufacture of semiconductor devices. Specifically, the disclosure relates to a method of forming a transition metal-comprising material on a substrate by a cyclic deposition process. The method comprises providing a substrate in a reaction chamber, providing a transition metal precursor comprising a transition metal compound in the reaction chamber, and providing a second precursor in the reaction chamber, wherein the transition metal compound comprises a transition metal halide bound to an adduct ligand, and the second precursor comprises a chalcogen or a pnictogen. The disclosure further relates to a method of forming a transition metal layer, and to semiconductor devices. Further, a vapor deposition assembly is disclosed.

19 Claims, 3 Drawing Sheets

DEPOSITION OF TRANSITION METAL-COMPRISING MATERIAL

CROSS-REFERENCE TO RELATED APPLICATIONS

This application is a continuation of, and claims priority to, U.S. patent application Ser. No. 17/666,903 filed Feb. 8, 2022 and titled DEPOSITION OF TRANSITION METAL-COMPRISING MATERIAL; which claims priority to U.S. Provisional Patent Application Ser. No. 63/148,241 filed Feb. 11, 2021 and titled DEPOSITION OF TRANSITION METAL-COMPRISING MATERIAL, the disclosures of which are hereby incorporated by reference in their entirety.

PARTIES OF JOINT RESEARCH AGREEMENT

The invention claimed herein was made by, or on behalf of, and/or in connection with a joint research agreement between University of Helsinki and ASM Microchemistry Oy. The agreement was in effect on and before the date the claimed invention was made, and the claimed invention was made as a result of activities undertaken within the scope of the agreement.

FIELD

The present disclosure relates to methods and apparatuses for the manufacture of semiconductor devices. More particularly, the disclosure relates to methods and systems for depositing transition metal-comprising material on a substrate, and layers comprising a transition metal-comprising material. The disclosure also relates to semiconductor device structures comprising transition metal-comprising material deposited by methods disclosed herein.

BACKGROUND

Transition metals, such as manganese, iron, cobalt, nickel and copper form a range of chalcogenides with different compositions and properties. For example, most of the cobalt and nickel sulfide phases are highly electrically conductive. As such, they may hold promise for microelectronics including functioning as barrier and seed layers for cobalt and copper interconnects. They may be promising materials in other applications, such as electrocatalysts for water splitting and electrodes in lithium ion and other batteries, solar cells and supercapacitors. Also other chalcogenides, such as selenides and tellurides, are explored for their potential in various microelectronic applications. In addition to chalcogenides, group 15 elements (pnictogens), most notably antimony (Sb), but also arsenic (As) and bismuth (Bi), offer potential for future semiconductor materials.

Transition metal sulfides are also potential precursors to metallic cobalt and nickel layers. In addition, cobalt and nickel sulfides are more stable toward oxidation and easier to synthesize than metallic 2D sulfides. As sulfides they may be more chemically compatible with semiconducting 2D sulfides, such as $MoS_2$, as e.g. contacts compared to metals, oxides, and other material groups.

Most of the possible future applications require ultrathin, continuous layers to be deposited on desired substrates and structures. In other cases, nanoparticles with controlled size may be preferred. In either case, few methods offering the necessary level of control are known, and each of the known methods containing drawbacks that may reduce the attractiveness of the materials in new applications.

Thus, there is need in the art for alternative methods for depositing transition metal chalcogenides, such as sulfides, as well as transition metal pnicides, such as antimonides.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing transition metal-comprising material on a substrate by cyclic vapor deposition process, to vapor deposition assemblies, as well as to semiconductor device structures.

In an aspect, a method of forming transition metal-comprising material on a substrate by a cyclic deposition process is disclosed. The method may comprise providing a substrate in a reaction chamber and providing a transition metal precursor in the reaction chamber, and providing a second precursor in the reaction chamber. The transition metal precursor may comprise a transition metal compound comprising a transition metal halide bound to an adduct ligand.

In another aspect, a method of forming a transition metal-comprising material on a substrate by a cyclic deposition process is disclosed. The method may comprise providing a substrate in a reaction chamber, providing a transition metal precursor comprising a transition metal compound comprising a transition metal halide bound to an adduct ligand in the reaction chamber, providing a second precursor in the reaction chamber, and contacting the transition metal-comprising material with a reducing agent thereby forming an elemental transition metal.

In a further aspect, semiconductor device structures comprising transition metal-comprising material and transition metal-comprising material deposited according to the current disclosure are disclosed.

In yet another aspect, a vapor deposition assembly for depositing a transition metal-comprising material on a substrate by a cyclic deposition method is disclosed. The vapor deposition assembly according to the current disclosure may comprise one or more reaction chambers constructed and arranged to hold the substrate and a precursor injector system constructed and arranged to provide a transition metal precursor comprising a transition metal compound comprising a transition metal halide bound to an adduct ligand and/or a second precursor in the reaction chamber in the reaction chamber in vapor phase. The vapor deposition assembly may further comprise a transition metal precursor vessel constructed and arranged to contain and evaporate the transition metal precursor comprising a transition metal compound comprising a transition metal halide bound to an adduct ligand, and a second precursor vessel constructed and arranged to contain and evaporate the second precursor. The vapor deposition assembly according to the current disclosure may be constructed and arranged to provide the transition metal precursor and/or the second precursor via the precursor injector system to the reaction chamber to deposit a transition metal-comprising material on the substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

The chemical formulas given for each of the example materials should not be construed as limiting and that the non-limiting example materials given should not be limited by a given example stoichiometry.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings.

DETAILED DESCRIPTION

Figure 1A:
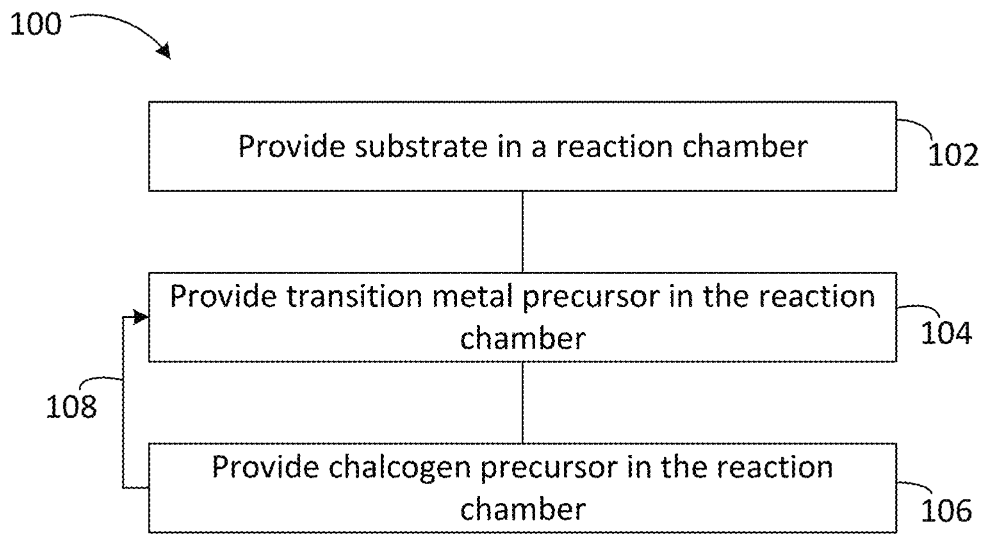
FIGS. 1A and 1B illustrate a process flow diagram of an exemplary embodiment of a method of depositing a transition metal-comprising material on a substrate according to the current disclosure.

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The illustrations presented herein are not meant to be actual views of any particular material, structure, or device, but are merely idealized representations that are used to describe embodiments of the disclosure.

In various methods according to the current disclosure, a substrate is provided in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

Substrate

As used herein, the term substrate may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

In some embodiments the substrate comprises-OH groups, such as a silicon oxide-based surface. In some embodiments, the substrate surface may additionally comprise —H terminations, such as an HF dipped Si (Si—H), or HF dipped Ge surface. In such embodiments, the surface of interest will be considered to comprise both the —H terminations and the material beneath the —H terminations.

Cyclic Deposition

A transition metal-comprising material is deposited using a cyclic deposition process. As used herein, the term "cyclic deposition" may refer to the sequential introduction of precursors (reactants) into a reaction chamber to deposit a layer over a substrate, and it includes processing techniques such as atomic layer deposition (ALD) and cyclic chemical vapor position (cyclic CVD). CVD type processes typically involve gas phase reactions between two or more precursors. The precursors may be provided simultaneously to a reaction chamber containing a substrate on which material is to be deposited. The precursors may be provided in partially or completely separated pulses. The substrate and/or reaction chamber can be heated to promote the reaction between the gaseous precursors. In some embodiments the precursors are provided until a layer having a desired thickness is deposited. In some embodiments, cyclic CVD type processes can be used with multiple cycles to deposit a thin film having a desired thickness. In cyclic CVD-type processes, the precursors may be provided to the reaction chamber in pulses that do not overlap, or that partially or completely overlap.

ALD-type processes are based on controlled, typically self-limiting surface reactions of precursors. Vapor phase reactions are avoided by feeding the precursors alternately and sequentially into the reaction chamber. Vapor phase precursors are separated from each other in the reaction chamber, for example, by removing excess precursors and/or reaction by-products from the reaction chamber between precursor pulses. This may be accomplished with an evacuation step and/or with an inert gas pulse or purge. In some embodiments the substrate is contacted with a purge gas, such as an inert gas. For example, the substrate may be contacted with a purge gas between precursor pulses to remove excess precursor and reaction by-products.

In some embodiments each reaction is self-limiting and monolayer by monolayer growth is achieved. These may be referred to as "true ALD" reactions. In some such embodiments the transition metal precursor may adsorb on the substrate surface in a self-limiting manner. A second precursor may react in turn with the adsorbed transition metal precursor to form up to a monolayer of transition metal-comprising material on the substrate. A third reactant, such as a reducing agent may be introduced to reduce a transition metal in the material into elemental transition metal.

In some embodiments, a deposition process for transition metal-containing material has one or more phases which are not self-limiting. For example, in some embodiments at least one of the precursors may be at least partially decomposed on the substrate surface. Thus, in some embodiments the process may operate in a process condition regime close to CVD conditions or in some cases fully in CVD conditions.

The method according to the current disclosure may also be used in a spatial atomic layer deposition apparatus. In spatial ALD, the precursors are supplied continuously in different physical sections and the substrate is moving between the sections. There may be provided at least two sections where, in the presence of a substrate, a half-reaction can take place. If the substrate is present in such a half-reaction section a monolayer may form from the first or second precursor. Then, the substrate is moved to the second half-reaction zone, where the ALD cycle is completed with the first or second precursor to form the target material. Alternatively, the substrate position could be stationary and the gas supplies could be moved, or some combination of the two. To obtain thicker films, this sequence may be repeated.

Purging means that vapor phase precursors and/or vapor phase byproducts are removed from the substrate surface such as by evacuating the reaction chamber with a vacuum pump and/or by replacing the gas inside a reaction chamber with an inert gas such as argon or nitrogen. Purging may be performed between two precursor pulses. Typical purging times are from about 0.05 to 20 seconds, and can be about 0.2 and 10, or between about 0.5 and 5 seconds. However, other purge times can be utilized if necessary, such as where highly conformal step coverage over extremely high aspect ratio structures or other structures with complex surface morphology is needed, or where different reactor types may be used, such as a batch reactor. As described above for ALD, purging may be performed in a temporal or in a spatial mode.

In this disclosure, "gas" can include material that is a gas at normal temperature and pressure (NTP), a vaporized solid and/or a vaporized liquid, and can be constituted by a single gas or a mixture of gases, depending on the context. The term "inert gas" can refer to a gas that does not take part in a chemical reaction to an appreciable extent. Exemplary inert gases include He and Ar and any combination thereof. In some cases, nitrogen and/or hydrogen can be an inert gas. A gas other than the process gas, i.e., a gas introduced without passing through a gas distribution assembly, other gas distribution device, or the like, can be used for, e.g., sealing the reaction space, and can include a seal gas, such as a rare gas.

The term "precursor" can refer to a compound that participates in the chemical reaction that produces another compound, and particularly to a compound that constitutes deposited material. The term "reactant" can be used interchangeably with the term precursor. However, a reactant may be used for chemistries that modify deposited material. For example, a reducing agent reducing a transition metal chalcogenide to an elemental metal may be called a reactant.

Deposited Material

Transition metal-comprising material may be deposited by the methods according to the current disclosure. In some embodiments, the transition metal is a first-row transition metal. In some embodiments, the transition metal is selected from a group consisting of manganese (Mn), iron (Fe), cobalt (Co), nickel (Ni), copper (Cu) and zinc (Zn). The transition metals may be selected from a group consisting of cobalt (Co), nickel (Ni) and copper (Cu). In some embodiments, the transition metal is selected from a group consisting of Co and Ni. Thus, transition metal-comprising material deposited by methods disclosed herein may comprise one or more transition metals, such as Co, Ni and/or Cu, and additionally one or more chalcogens or pnictogens. Chalcogens are considered to be the elements of Group 16 of the periodic table of elements, except oxygen. In some embodiments, the chalcogen is selected from a group consisting of sulfur(S), selenium (Se) and tellurium (Te). The transition metal-comprising material according to the current disclosure may comprise, for example, Co and S, Co and Se or Co and Te. In some embodiments, the transition metal-comprising material according to the current disclosure may comprise Cu and S, Cu and Se or Cu and Te. In some embodiments, the transition metal-comprising material according to the current disclosure may comprise Ni and S, Ni and Se or Ni and Te.). The transition metal-comprising material according to the current disclosure may comprise, for example, Mn and S, Mn and Se or Mn and Te. The transition metal-comprising material according to the current disclosure may comprise, for example, Fe and S, Fe and Se or Fe and Te.

In the current disclosure, pnictogens are considered to be the elements of Group 15 of the periodic table of elements, except nitrogen. In some embodiments, the pnictogen is selected from a group consisting of arsenic (As), antimony (Sb) and bismuth (Bi). Thus, the transition metal-comprising material according to the current disclosure may comprise, for example, Co and As, Co and Sb or Co and Bi. In some embodiments, transition metal-comprising material according to the current disclosure may comprise, for example, Mn and As, Mn and Sb or Mn and Bi. In some embodiments, transition metal-comprising material according to the current disclosure may comprise, for example, Fe and As, Fe and Sb or Fe and Bi. In some embodiments, transition metal-comprising material according to the current disclosure may comprise, for example, Ni and As, Ni and Sb or Ni and Bi. In some embodiments, transition metal-comprising material according to the current disclosure may comprise, for example, Cu and As, Cu and Sb or Cu and Bi.

Transition metal chalcogenides may exist in various phases. Unless otherwise indicated, the transition metal chalcogenides are referred to in a general form without specifying a general phase. For example, $CoS_x$ may mean any cobalt sulfide phase, such as $Co_4S_3$, $Co_9S_8$, CoS, $Co_3S_4$, or $CoS_2$, or a combination thereof. $NiS_x$ may mean any nickel sulfide phase, such as $Ni_3S_2$, $Ni_3S_8$, β-NiS, $Ni_3S_4$, or $NiS_2$, or a combination thereof. Further $CuS_x$ may mean any copper sulfide phase, such as $CuS_2$, CuS, $Cu_9S_8$, or a combination thereof. However, in some embodiments, the transition metal-comprising material comprises, consist essentially of, or consist of $Co_9S_8$ (cobalt pentlandite). In some embodiments, the transition metal-comprising material comprises, consist essentially of, or consist of β-NiS. In some embodiments, the transition metal-comprising material may comprise, consist essentially of, or consist of $Ni_9S_8$. However, in some embodiments, the transition metal chalcogenide deposited according to the current disclosure comprises a mixture of different phases. Exemplary phases that may be present in the material are $Cu_2S$, $Cu_{31}S_{16}$, $Cu_{58}S_{32}$, $Cu_9S_5$, $Cu_7S_4$, $Cu_8S_5$, $Cu_{39}S_{28}$, $Cu_9S_8$, CuS, and $CuS_2$. In some embodiments, transition metal-comprising material may have a S/Co ratio of 0.9-1.0.

In some embodiments, a transition metal-comprising material may comprise, for example, from about 70 to about 99.5 at. % transition metal chalcogenide or transition metal pnictide, or from about 80 to about 99.5 at. % transition metal chalcogenide or transition metal pnictide, or from about 90 to about 99.5 at. % transition metal chalcogenide or transition metal pnictide. A transition metal-comprising material deposited by a method according to the current disclosure may comprise, for example about 80 at. %, about 83 at. %, about 85 at. %, about 87 at. %, about 90 at. %, about 95 at. %, about 97 at. % or about 99 at. % transition metal chalcogenide or transition metal pnictide.

In some embodiments, the transition metal-comprising material deposited according to the current disclosure comprises less than about 3 at. %, or less that about 1 at. % chlorine. In some embodiments, the transition metal-comprising material deposited according to the current disclosure comprises less than about 1 at. %, or less that about 0.5 at. % oxygen. In some embodiments, the transition metal-comprising material deposited according to the current disclosure comprises less than about 2 at. %, or less that about 1 at. %, %, or less that about 0.5 at. % carbon. In some embodiments, the transition metal-comprising material deposited according to the current disclosure comprises less than about 0.5 at. %, or less that about 0.2 at. %, or less that about 0.1 at. % nitrogen. In some embodiments, the transition metal-comprising material deposited according to the current disclosure comprises less than about 1.5 at. %, or less that about 1 at. % hydrogen.

In some embodiments, the transition metal-comprising material consists essentially of, or consists of, transition metal-comprising material. In some embodiments, the transition metal-comprising material consist essentially of, or consist of, cobalt sulfide. In some embodiments, the transition metal-comprising material consist essentially of, or consist of, nickel sulfide. In some embodiments, the transition metal-comprising material consist essentially of, or consist of, copper sulfide. In some embodiments, the transition metal-comprising material consist essentially of, or consist of, cobalt selenide. In some embodiments, the transition metal-comprising material consist essentially of, or consist of, nickel selenide. In some embodiments, the transition metal-comprising material consist essentially of, or consist of, copper selenide. In some embodiments, the transition metal-comprising material consist essentially of, or consist of, cobalt telluride. In some embodiments, the transition metal-comprising material consist essentially of, or consist of, nickel telluride. In some embodiments, the transition metal-comprising material consist essentially of, or consist of, copper telluride.

In some embodiments, transition metal-comprising material deposited according to the current disclosure may form a layer. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous. In some embodiments, the transition metal-comprising material forms a substantially continuous layer at a thickness of 10 nm or below.

In an aspect, a semiconductor device structure comprising material deposited according to the method presented herein is disclosed.

As used herein, a "structure" can be or include a substrate as described herein. Structures can include one or more layers overlying the substrate, such as one or more layers formed according to a method according to the current disclosure.

Selective Deposition

In some embodiments, the substrate comprises a first surface comprising a first material and a second surface comprising a second material, wherein the transition metal-comprising material is selectively deposited on the first surface relative to the second surface. By appropriately selecting the deposition conditions, transition metal-comprising material may be selectively deposited on a first surface relative to a second surface. The methods according to the current disclosure may be performed without pre-treatments, such as passivation or other surface treatments to bring about selectivity. Thus, in some embodiments of the methods presented in the current disclosure, the deposition is inherently selective. However, as is understood by the skilled person, selectivity may be affected by processes such as cleaning of substrate surface, etching or the like.

Selectivity can be given as a percentage calculated by [(deposition on first surface)−(deposition on second surface)]/(deposition on the first surface). Deposition can be measured in any of a variety of ways. In some embodiments, deposition may be given as the measured thickness of the deposited material. In some embodiments, deposition may be given as the measured amount of material deposited.

In some embodiments, selectivity is greater than about 30%, greater than about 50%, greater than about 75%, greater than about 85%, greater than about 90%, greater than about 93%, greater than about 95%, greater than about 98%, greater than about 99% or even greater than about 99.5%. In embodiments, the selectivity can change over the duration or thickness of a deposition.

In some embodiments, deposition only occurs on the first surface and does not occur on the second surface. In some embodiments, deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications.

In some embodiments the transition metal-comprising material deposited on the first surface of the substrate may have a thickness less than about 50 nm, less than about 20 nm, less than about 10 nm, less than about 5 nm, less than about 3 nm, less than about 2 nm, or less than about 1 nm, while a ratio of transition metal-comprising material deposited on the first surface of the substrate relative to the second surface of the substrate may be greater than or equal to about 2:1, greater than or equal to about 20:1, greater than or equal to about 15:1, greater than or equal to about 10:1, greater than or equal to about 5:1, greater than or equal to about 3:1, or greater than or equal to about 2:1.

In some embodiments, selectivity of the selective deposition processes described herein may depend on the materials which comprise the first and/or second surface. For example, in some embodiments, where the first surface comprises a Cu surface and the second surface comprises a silicon dioxide surface, the selectivity may be greater than about 10:1 or greater than about 20:1. In some embodiments, where the first surface comprises a metal or metal oxide and the second surface comprises a silicon dioxide surface, the selectivity may be greater than about 5:1.

Transition Metal Precursors

A transition metal is introduced in the transition metal-comprising material by a transition metal precursor. In some embodiments, the transition metal precursor may comprise a transition metal compound with an adduct forming ligand. In some embodiments, the transition metal precursor may comprise a transition metal halide compound. In some embodiments, the transition metal precursor may comprise a transition metal compound with an adduct forming ligand, such as monodentate, bidentate, or multidentate adduct forming ligand. In some embodiments, the transition metal precursor may comprise a transition metal halide compound with adduct forming ligand, such as monodentate, bidentate, or multidentate adduct forming ligand. In some embodiments, the transition metal precursor may comprise a transition metal compound with adduct forming ligand comprising nitrogen, such as monodentate, bidentate, or multidentate adduct forming ligand comprising nitrogen. In some embodiments, the transition metal precursor may comprise a transition metal compound with adduct forming ligand comprising phosphorous, oxygen, or sulfur, such as monodentate, bidentate, or multidentate adduct forming ligand comprising phosphorous, oxygen or sulfur. For example, in some embodiments, the transition metal halide compound may comprise a transition metal chloride, a transition metal iodide, a transition metal fluoride, or a transition metal bromide. In some embodiments, the transition metal halide compound may comprise a transition metal species, including, but not limited to, at least one of manganese, iron, cobalt, nickel, copper or zinc. In some embodiments, the transition metal halide compound may comprise at least one of a cobalt chloride, a nickel chloride, or a copper chloride. In some embodiments, the transition metal halide compound may comprise at least one of a cobalt bromide, a nickel bromide, or a copper bromide. In some embodiments, the transition metal halide compound may comprise at least one of a cobalt fluoride, a nickel fluoride, or a copper fluoride. In some embodiments, the transition metal halide compound may comprise at least one of a cobalt iodide, a nickel iodide, or a copper iodide.

In some embodiments, the transition metal halide compound may comprise a bidentate nitrogen-comprising adduct forming ligand. In some embodiment, the transition metal halide compound may comprise an adduct forming ligand including two nitrogen atoms, wherein each of the nitrogen atoms are bonded to at least one carbon atom. In some embodiments of the disclosure, the transition metal halide compound comprises one or more nitrogen atoms bonded to a central transition metal atom thereby forming a metal complex.

In some embodiments of the disclosure, the transition metal precursor may comprise a transition metal compound having the formula (I):

$$(\text{adduct})_n\text{-M-X}_a \quad (1)$$

wherein each of the “adducts” is an adduct forming ligand and can be independently selected to be a mono-, a bi-, or a multidentate adduct forming ligand or mixtures thereof: n is from 1 to 4 in case of monodentate forming ligand, n is from 1 to 2 in case of bi- or multidentate adduct forming ligand; M is a transition metal, such as, for example, cobalt (Co), copper (Cu), or nickel (Ni); wherein each of $X_a$ is another ligand, and can be independently selected to be a halide or other ligand; wherein a is from 1 to 4, and some instances a is 2.

In some embodiments of the disclosure, the adduct forming ligand in the transition metal compound, such as a transition metal halide compound, may comprise a monodentate, bidentate, or multidentate adduct forming ligand which coordinates to the transition metal atom, of the transition metal compound, through at least one of a nitrogen atom, a phosphorous atom, an oxygen atom, or a sulfur atom. In some embodiments of the disclosure, the adduct forming ligand in the transition metal compound may comprise a cyclic adduct ligand. In some embodiments of the disclosure, the adduct forming ligand in the transition metal compound may comprise mono, di-, or polyamines. In some embodiments of the disclosure, the adduct forming ligand in the transition metal compound may comprise mono-, di-, or polyethers. In some embodiments, the adduct forming ligand in the transition metal compound may comprise mono-, di-, or polyphosphines. In some embodiments, the adduct forming ligand in the transition metal compound may comprise carbon and/or in addition to the nitrogen, oxygen, phosphorous, or sulfur in the adduct forming ligand.

In some embodiments, the adduct forming ligand in the transition metal compound may comprise one monodentate adduct forming ligand. In some embodiments of the disclosure, the adduct forming ligand in the transition metal compound may comprise two monodentate adduct forming ligands. In some embodiments of the disclosure, the adduct forming ligand in the transition metal compound may comprise three monodentate adduct forming ligands. In some embodiments of the disclosure, the adduct forming ligand in the transition metal compound may comprise four monodentate adduct forming ligands. In some embodiments of the disclosure, the adduct forming ligand in the transition metal compound may comprise one bidentate adduct forming ligand. In some embodiments of the disclosure, the adduct forming ligand in the transition metal compound may comprise two bidentate adduct forming ligands. In some embodiments of the disclosure, the adduct forming ligand in the transition metal compound may comprise one multidentate adduct forming ligand. In some embodiments of the disclosure, the adduct forming ligand in the transition metal compound may comprise two multidentate adduct forming ligands.

In some embodiments, the adduct forming ligand comprises nitrogen, such as an amine, a diamine, or a polyamine adduct forming ligand. In such embodiments, the transition metal compound may comprise at least one of, triethylamine (TEA), N,N,N',N'-tetramethyl-1,2-ethylenediamine (CAS: 110-18-9, TMEDA), N,N,N',N'-tetraethylethylenediamine (CAS: 150-77-6, TEEDA), N,N'-diethyl-1,2-ethylenediamine (CAS: 111-74-0, DEEDA), N,N'-diisopropylethylenediamine (CAS: 4013-94-9), N,N,N',N'-tetramethyl-1,3-propanediamine (CAS: 110-95-2, TMPDA), N,N,N',N'-tetramethylmethanediamine (CAS: 51-80-9, TMMDA), N,N,N',N",N"-pentamethyldiethylenetriamine (CAS: 3030-47-5, PMDETA), diethylenetriamine (CAS: 111-40-0, DIEN), triethylenetetraamine (CAS: 112-24-3, TRIEN), tris(2-aminoethyl)amine (CAS: 4097-89-6, TREN, TAEA), 1,1,4,7,10,10-hexamethyltriethylenetetramine (CAS: 3083-10-1, HMTETA), 1,4,8,11-tetraazacyclotetradecane (CAS: 295-37-4, Cyclam), 1,4,7-Trimethyl-1,4,7-triazacyclononane (CAS: 96556-05-07), or 1,4,8,11-tetramethyl-1,4,8,11-tetraazacyclotetradecane (CAS: 41203-22-9).

In some embodiments, the adduct forming ligand comprises phosphorous, such as a phosphine, a diphosphine, or a polyphosphine adduct forming ligand. For example, the transition metal compound may comprise at least one of triethylphosphine (CAS: 554-70-1), trimethyl phosphite (CAS: 121-45-9), 1,2-bis(diethylphosphino)ethane (CAS: 6411-21-8, BDEPE), or 1,3-bis(diethylphosphino) ropane (CAS: 29149-93-7).

In some embodiments of the disclosure, the adduct forming ligand comprises oxygen, such as an ether, a diether, or a polyether adduct forming ligand. For example, the transition metal compound may comprise at least one of, 1,4-dioxane (CAS: 123-91-1), 1,2-dimethoxyethane (CAS: 110-71-4, DME, monoglyme), diethylene glycol dimethyl ether (CAS: 111-96-6, diglyme), triethylene glycol dimethyl ether (CAS: 112-49-2, triglyme), or 1,4,7,10-tetraoxacyclododecane (CAS: 294-93-9, 12-Crown-4).

In some embodiments, the adduct forming ligand may comprise a thioether, or mixed ether amine, such as, for example, at least one of 1,7-diaza-12-crown-4:1,7-dioxa-4,10-diazacyclododecane (CAS: 294-92-8), or 1,2-bis(methylthio)ethane (CAS: 6628-18-8).

In some embodiments, the bidentate nitrogen-comprising ligand is N,N,N',N'-tetramethylethylenediamine (TMEDA) or N,N,N',N'-tetramethyl-1,3-propanediamine (TMPDA). In some embodiments, the transition metal halide compound may comprise cobalt chloride N,N,N',N'-tetramethyl-l,2-ethylenediamine ($CoCl_2$(TMEDA). In some embodiments, the transition metal halide compound may comprise cobalt bromide N,N,N',N'-tetramethyl-1,2-ethylenediamine ($CoBr_2$(TMEDA)). In some embodiments, the transition metal halide compound may comprise cobalt iodide N,N,N',N'-tetramethyl-1,2-ethylenediamine ($CoI_2$(TMEDA)). In some embodiments, the transition metal halide compound may comprise cobalt chloride N,N,N',N'-tetramethyl-1,3-propanediamine ($CoCl_2$(TMPDA)). In some embodiments, the transition metal halide compound may comprise at least one of cobalt chloride N,N,N',N'-tetramethyl-1,2-ethylenediamine ($CoCl_2$(TMEDA)), nickel chloride tetramethyl-1,3-propanediamine ($NiCl_2$(TMPDA)), or nickel iodide tetramethyl-1,3-propanediamine ($NiI_2$(TMPDA)).

In some embodiments, the transition metal precursor comprises cobalt bromide N,N,N',N'-tetramethyl-1,3-propanediamine ($CoBr_2$(TMPDA). In some embodiments, the transition metal precursor comprises cobalt iodide N,N,N',N'-tetramethyl-1,3-propanediamine ($CoI_2$(TMPDA)). In some embodiments, the transition metal precursor comprises cobalt iodide N,N,N',N'-tetraethylethylenediamine ($CoI_2$ (TEEDA)).

In some embodiments of the disclosure, contacting the substrate with a transition metal precursor may comprise providing the transition metal precursor in the reaction chamber for a time period of between about 0.01 seconds and about 60 seconds, between about 0.05 second sand about 10 seconds, between about 0.1 seconds and about 5.0 seconds, between about 0.5 seconds and about 10 seconds, between about 1 second and about 30 seconds. For example, the transition metal precursor may be provided in the reaction chamber for about 0.5 seconds, for about 1 second, for about 1.5 seconds, for about 2 seconds or for about 3 seconds. In addition, during the pulsing of the transition metal precursors, the flow rate of the transition metal precursor may be less than 2000 sccm, or less than 500 sccm, or even less than 100 sccm. In addition, during providing the transition metal precursor over the substrate the now rate of the transition metal precursor may range from about 1 to 2000 sccm, from about 5 to 1000 sccm, or from about 10 to about 500 sccm.

Excess transition metal precursor and reaction byproducts (if any) may be removed from the surface, e.g., by pumping with an inert gas. For example, in some embodiments of the disclosure, the methods may comprise a purge cycle wherein the substrate surface is purged for a time period of less than approximately 2.0 seconds. Excess transition metal precursor and any reaction byproducts may be removed with the aid of a vacuum, generated by a pumping system, in fluid communication with the reaction chamber.

In some embodiments, a heteroleptic transition metal precursors may be used. As an example, $Co(btsa)_2$(THF)-comprising transition metal precursor may be used. In another example, $Ni(btsa)_2$(THF)-comprising transition metal precursor may be used. These transition metal precursors comprise a tetrahydrofurane (THF) ring attached to a transition metal atom through the ring oxygen. The transition metal precursor further comprises two bis(trimethylsilyl)amide ligands attached to the same transition metal atom through their nitrogen atoms.

Second Precursor

In some embodiments, second precursor may refer to a precursor compound comprising a chalcogen, wherein a chalcogen is an element from Group 16 of the periodic table of elements, including sulfur, selenium, and tellurium. In some embodiments, the second precursor comprises a chalcogen. Various second precursors may be used in a method according to the current disclosure. In some embodiments, the second precursor comprises a chalcogen hydride. In some embodiments, a second precursor is selected from the following list: $H_2S$, $H_2Se$, $H_2Te$, $(CH_3)_2S$, $(NH_4)_2S$, dimethylsulfoxide ($(CH_3)_2SO$), $(CH_3)_2Se$, $(CH_3)_2Te$, elemental or atomic S, other precursors comprising chalcogen-hydrogen bonds, such as $H_2S_2$, $H_2Se_2$, $H_2Te_2$, or chalcogenols with the formula R—Y—H, wherein R can be a substituted or unsubstituted hydrocarbon, for example a C1-C8 alkyl or substituted alkyl, such as an alkylsilyl group, for example a linear or branched C1-C5 alkyl group, and Y can be S, Se, or Te. In some embodiments, a second precursor comprises a thiol with the formula R—S—H, wherein R can be substituted or unsubstituted hydrocarbon, for example C1-C8 alkyl group, more linear or branched, for example C1-C5 alkyl group. In some embodiments, a second precursor comprises a selenol with the formula R—Se—H, wherein R can be substituted or unsubstituted hydrocarbon, for example C1-C8 alkyl group, more linear or branched, for example C1-C5 alkyl group.

In some embodiments a second precursor may comprise a compound having the formula (II):

$$(R_3Si)_2Y \quad \text{(II)}$$

wherein $R_3Si$ is an alkylsilyl group and Y can be S, Se or Te.

In some embodiments, a second precursor comprises S or Se. In some embodiments, a second precursor comprises S. In some embodiments, a second precursor does not comprise S. In some embodiments the second precursor may comprise an elemental chalcogen, such as elemental sulfur. In some embodiments, a second precursor comprises Te. In some embodiments, a second precursor does not comprise Te. In some embodiments, a second precursor comprises Se. In some embodiments, a second precursor does not comprise Se. In some embodiments, a second precursor is selected from precursors comprising S, Se or Te. In some embodiments, a second precursor comprises a compound having the formula (III):

$$H_2S_n, \quad \text{(III)}$$

wherein n is from 4 to 10.

In some embodiments, suitable second precursors may include any number of chalcogen-comprising compounds. In some embodiments, a second precursor may comprise at least one chalcogen-hydrogen bond. In some embodiments the second precursor may comprise a chalcogen plasma, chalcogen atoms or chalcogen radicals. In some embodiments where an energized second precursor is desired, a plasma may be generated in the reaction chamber or upstream of the reaction chamber. In some embodiments the second precursor does not comprise an energized second precursor, such as plasma, atoms or radicals. In some embodiments the second precursor may comprise a chalcogen plasma, chalcogen atoms or chalcogen radicals formed from a second precursor comprising a chalcogen-hydrogen bond, such as $H_2S$. In some embodiments a second precursor may comprise a chalcogen plasma, chalcogen atoms or chalcogen radicals such as a plasma comprising sulfur, selenium or tellurium, preferably a plasma comprising sulfur. In some embodiments, the plasma, atoms, or radicals comprise tellurium. In some embodiments, the plasma, atoms or radicals comprise selenium. In some embodiments the second precursor does not comprise a tellurium precursor.

In some embodiments, the purity of the chalcogen comprising vapor phase precursors may influence the composition of the deposited material and therefore high purity sources of the chalcogen comprising vapor phase precursor may be utilized. In some embodiments, the chalcogen comprising vapor phase precursor may have a purity of greater than or equal to 95.0%, or a purity of greater than or equal to 98.0%, or a purity of greater than or equal to 99.0%, or a purity of greater than or equal to 99.5%. As a non-limiting example, the second precursor may comprise hydrogen sulfide ($H_2S$) with a purity of greater than or equal to 99.0% or of greater than or equal to 99.5%.

In some embodiments, the second precursor comprises a pnictogen. In some embodiments, the pnictogen is selected from a group consisting of As, Sb and Bi. In some embodiments, the pnictogen is selected from a group consisting of As and Sb. In some embodiments, the pnictogen is Sb. In some embodiments, the pnictogen is As. In some embodiments, the pnictogen is Bi. For example, the pnictogen-comprising second precursor may comprise an alkylsilyl pnictide.

In some embodiments, in addition to utilizing high purity second precursors, the second precursor gas may be further purified to remove unwanted impurities. Therefore, some embodiments of the disclosure may further comprise, flowing a second precursor through a gas purifier prior to entering the reaction chamber to reduce the concentration of at least one of water, or oxygen, within the second precursor.

In some embodiments, the water, or oxygen concentration within the second precursor may be reduced to less than 5 atomic-%, or less than 1 atomic-%, or less than 1000 parts per million, or less than 100 parts per million, or less than 10 parts per million, or less than 1 part per million, or less than 100 parts per billion, or less than 10 parts per billion, or even less than 1 part per billion.

Without limiting the current disclosure to any specific theory, the reduction of at least one of the water concentration, or the oxygen concentration within the second precursor may allow for the deposition of transition metal chalcogenide material with the desired composition whilst preventing the deposition of transition metal oxide phases at an appropriate deposition temperature.

In some embodiments, providing a second precursor in the reaction chamber (i.e. exposing the substrate to the second precursor) may comprise, pulsing the second precursor (e.g., hydrogen sulfide) over the substrate for a time period of between 0.1 seconds and 2.0 seconds, or from about 0.01 seconds to about 20 seconds, or from about 0.01 seconds to about 60 seconds, or from about 0.01 seconds to about 10 seconds. In some embodiments, a second precursor may be provided in the reaction chamber for less than about 40 seconds, or less than about 30 seconds, or less than about 20 seconds, or less than about 10 seconds, or less than about 5 seconds, or less than about 3 seconds. During providing a second precursor in the reaction chamber, a flow rate of a second precursor may be less than about 100 sccm, or less than about 50 sccm, or less than about 25 sccm. For example, a flow rate of a second precursor may be between about 10 sccm and about 20 sccm, such as about 15 sccm. In addition, during providing a second precursor over the substrate the flow rate of the second precursor may be from about 1 sccm to about 2000 sccm, or from about 5 sccm to about 1000 sccm, or from about 10 sccm to about 500 sccm.

The second precursor may react with transition metal-comprising molecules on the substrate. In some embodiments, the second precursor may comprise hydrogen sulfide and the reaction may deposit a transition metal sulfide on the substrate.

Reducing Agent

In some embodiments of the disclosure, exemplary cyclical deposition methods of the disclosure may comprise an additional process step comprising, contacting the substrate with a reducing agent. In such embodiments, a method of forming a transition metal-comprising material on a substrate by a cyclic deposition process is disclosed. The method comprises providing a substrate in a reaction chamber and providing a transition metal precursor comprising a transition metal halide bound to an adduct ligand in the reaction chamber. The method further comprises providing a second precursor in the reaction chamber, and contacting the transition metal-comprising material with a reducing agent thereby forming an elemental transition metal.

Thus, in some embodiments, the transition metal-comprising material on the substrate is contacted with a reducing agent. In some embodiments, the reducing agent precursor comprises at least one of forming gas ($H_2$+$N_2$), ammonia ($NH_3$), an ammonia ($NH_3$) plasma, hydrazine ($N_2H_4$), molecular hydrogen ($H_2$), hydrogen atoms (H), a hydrogen plasma, hydrogen radicals, hydrogen excited species, alcohols, aldehydes, carboxylic acids, boranes, or amines, tertiary butyl hydrazine ($C_4H_{12}N_2$), silane ($SiH_4$), disilane ($Si_2H_6$), trisilane ($Si_3H_8$), germane ($GeH_4$), digermane ($Ge_2H_6$), borane ($BH_3$), and diborane ($B_2H_6$), or an organic reducing agent. Organic reducing agents may comprise, for example alcohols, aldehydes, or carboxylic acids.

A reducing agent may be provided in the reaction chamber and contact the substrate at a at each deposition cycle, i.e. after each time a transition metal precursor and a second precursor have been provided in the reaction chamber. Alternatively, a reducing agent may be provided in the reaction chamber and contact the substrate after a predetermined number of deposition cycles have been performed. For example, a reducing agent may be provided in the reaction chamber after every 5, 10, 20 40, 50 or 100 cycles of depositing a transition metal chalcogenide or a transition metal pnictide on the substrate. As a further alternative, a reducing agent may be provided in the reaction chamber at the end of a deposition process. Thus, the desired amount of transition metal-comprising material is first deposited, and the deposited material is then exposed to a reducing agent. In some embodiments, the reducing agent may be provided in the reaction chamber and contact the substrate separately from the transition metal precursor and separately from the second precursor.

In some embodiments, the transition metal-comprising material may be exposed to the reducing agent at a temperature of less than 500 °C, or less than 400 °C, or less than 300 °C, or less than 250 °C, or less than 200 °C, or even less than 150 °C. In some embodiments, the transition metal-comprising material may be exposed to the reducing agent in a reduced pressure atmosphere, wherein the pressure may be from about 0.001 mbar to about 10 bar, or from about 1 mbar to about 1000 mbar. The substrate may be exposed to a reducing agent in the same reaction chamber in which the deposition of the transition metal-comprising material is performed. Alternatively, the substrate may be exposed to the reducing agent in a different reaction chamber. The different reaction chamber may be a part of the same cluster tool as the reaction chamber in which the transition metal-comprising material is deposited.

Drawings

The disclosure is further explained by the following exemplary embodiments depicted in the drawings. The illustrations presented herein are not meant to be actual views of any particular material, structure, or device, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1A is a process flow diagram of an exemplary embodiment of a method 100 of depositing a transition metal-comprising material on a substrate according to the current disclosure. In the method, a transition metal-comprising material is deposited on a substrate by a cyclic deposition process. The method comprises providing a substrate in a reaction chamber 102. In some embodiments, the substrate may comprise silicon. In some embodiments, the substrate may comprise, consist essentially of, or consist of silicon oxide.

The reaction chamber can form part of an atomic layer deposition (ALD) reactor. The reactor may be a single wafer reactor. Alternatively, the reactor may be a batch reactor. Various phases of method 100 can be performed within a single reaction chamber or they can be performed in multiple reactor chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, a reactor including the reaction chamber can be provided with a heater to activate the reactions by elevating the temperature of one or more of the substrate and/or the reactants and/or precursors.

During step 102, the substrate can be brought to a desired temperature and pressure for providing transition metal precursor in the reaction chamber 104 and/or for providing a second precursor in the reaction chamber 106. A temperature (e.g. of a substrate or a substrate support) within a reaction chamber can be, for example, from about 50 °C to about 350 °C, from about 100 °C to about 300 °C, from about 120 °C to about 170 °C or from about 150 °C to about 200 °C. As a further example, a temperature within a reaction chamber can be from about 275 °C to about 325 °C, or from about 100 °C to about 225 °C. The temperature used may be selected according to the precursor. For example, if a transition metal precursor comprising $CoCl_2$(TMEDA) is used, the deposition temperature may range from about 175 °C to about 325 °C. For example, deposition temperature may be 180 °C, 200 °C, 225 °C, 250 °C, 275 °C or 300 °C. If $NiCl_2$(TMPDA) is used as a transition metal precursor, a deposition temperature may range from about 150 °C to about 280 °C, such as 165 °C, 175 °C, 185 °C, 225 °C or 250 °C may be used.

In some embodiments, the pressure in the reaction chamber during deposition according to the current disclosure is below 50 mbar, or below 10 mbar. In some embodiments, the pressure in the reaction chamber during deposition according to the current disclosure is about 5 mbar.

In the first deposition phase 104 of a method according to the current disclosure, a transition metal precursor is provided in the reaction chamber. The transition metal precursor may comprise a transition metal compound. The transition metal compound may comprise a transition metal halide bound to an adduct ligand. In some embodiments, the adduct ligand may comprise a bidentate nitrogen-containing adduct ligand. In some embodiments, the bidentate nitrogen-containing adduct ligand may comprise two nitrogen atoms, each of the nitrogen atoms bonded to at least one carbon atom. In some embodiments, the bidentate nitrogen-comprising ligand is N,N,N',N'-tetramethylethylenediamine (TMEDA) or N,N,N',N'-tetramethyl-1,3-propanediamine (TMPDA). In some embodiments, the transition metal halide comprises a transition metal chloride. In some embodiments, the transition metal halide is a transition metal chloride. In some embodiments, the transition metal compound comprises one of $CoCl_2$(TMEDA) and $NiCl_2$ (TMPDA). In some embodiments, the transition metal compound is one of $CoCl_2$(TMEDA) and $NiCl_2$(TMPDA).

In the second deposition phase 106 of a method according to the current disclosure, a second precursor is provided in the reaction chamber. In some embodiments, the second precursor comprises a chalcogen, and the chalcogen is selected from a group consisting of sulfur, selenium and tellurium. In some embodiments, the second precursor comprises a chalcogen and hydrogen. In some embodiments, the second precursor comprises a chalcogen-hydrogen bond. For example, the second precursor may be $H_2S$ or the second precursor may be $H_2Se$. In some embodiments, the second precursor comprises an alkyl group. In some embodiments, the second precursor is selected from a group consisting of $H_2S$, $H_2Se$, $H_2Te$, $(CH_3)_2S$, $(NH_4)_2S$, $(CH_3)_2SO$, $(CH_3)_2Se$ and $(CH_3)_2Te$.

In some embodiments, transition metal precursor may be heated before providing it into the reaction chamber. For example, the transition metal precursor may be heated from about 60 °C to about 180 °C, such as to about 100 °C, to about 110 °C, to about 120 °C, to about 150 °C, or to about 170 °C. As a non-limiting example, a transition metal halide bound to a bidentate nitrogen-comprising adduct ligand precursor, such as $CoCl_2$(TMEDA) or $NiCl_2$(TMPDA), may be heated to about 150 °C, to about 160 °C, or to about 170 °C. For some other transition metal precursors, such as transition metal precursors comprising a silylamide ligand may be heated to a lower temperature, such as to about 60 °C or to about 80 °C.

In some embodiments, second precursor may be heated before providing it to the reaction chamber. In some embodiments, the second precursor may held in ambient temperature before providing it to the reaction chamber. In some embodiments, the flow of a second precursor may be regulated through a pressure regulator and/or by a needle valve. This may have advantages especially for highly volatile second precursors, such as $H_2S$. In some embodiments, the second precursor may be heated from about 40 °C to about 60 °C, such as to about 50 °C. For example, in a second precursor may be heated in embodiments where the second precursor comprises selenium or tellurium.

Phases of providing a transition metal precursor 104 and providing a second precursor 106 may be performed in any order. The phases of providing a transition metal precursor 104 and providing a second precursor 106 may constitute a deposition cycle, resulting in the deposition of transition metal-comprising material. In some embodiments, the two phases of transition metal-comprising material deposition, namely providing the transition metal precursor and the second precursor in the reaction chamber (104 and 106), may be repeated (loop 108). Such embodiments contain several deposition cycles. The thickness of the deposited transition metal may be regulating by adjusting the number of deposition cycles. The deposition cycle (loop 108) may be repeated until a desired transition metal thickness is achieved. For example, about 50, 100, 200, 300, 400, 500, 700, 800, 1,000, 1,200, 1,500, 2,000, 2,400 or 3,000 deposition cycles may be performed.

In a non-limiting example, cobalt sulfide may be deposited on silicon oxide-containing material, such as native oxide and thermal oxide surfaces. $CoCl_2$(TMEDA) as the transition metal precursor and $H_2S$ (with a flow rate of 14 sccm, for example) as the second precursor may be used. A pulse time of 1 second for $CoCl_2$(TMEDA), and a pulse time of 2 seconds for $H_2S$ pulses may be used, and each subsequent precursor pulses may be separated by 1-second purges. The substrate may comprise native silicon oxide or soda lime glass, and the deposition temperature may be from 180 °C to 275 °C. The deposition may be performed under a $N_2$ pressure of approximately 5 mbar.

The deposited cobalt sulfide material may have a resistivity of 70μΩ cm, for example. In some embodiments, the resistivity of the material may increase with a decreasing deposition temperature. Furthermore, the material uniformity may depend on the deposition temperature, and in some embodiments, 275 °C may be a suitable temperature to obtain uniform cobalt sulfide layers. The cobalt sulfide may comprise $Co_9S_8$ phase.

The growth rate of cobalt sulfide material may be, for example from about 0.1 to about 1 Å/cycle. For example, at a temperature of 180 °C, the growth rate of cobalt sulfide may be, for example, about 0.2 Å/cycle, and at a temperature of 275 °C from about 0.6 Å/cycle to about 1 Å/cycle. However, In some embodiments, growth rate of, for example, about 3 Å/cycle may be observed. The growth rate may vary during a deposition process. A longer $H_2S$ pulse may increase the growth rate of the deposited material. For example, the pulse length may be varied from 1 second to 6 seconds. Longer pulse length may also decrease the resistivity of the deposited material. For example, with a shorter pulse length, the resistivity of the cobalt sulfide material may be about 100μΩ cm, whereas using longer pulse time may reduce the material resistivity to about 70μΩ cm. The S/Co ratio of the deposited material may remain unchanged (at approximately 0.9) irrespective of the pulse length.

In some embodiments, the deposited material may consist essentially of, or consist of, only cubic $Co_9S_8$ (cobalt pentlandite). The layer crystallinity may increase with increasing deposition temperature. Low oxygen (less than 1 at. %, or less than 0.5 at. %), carbon (less than 2 at. %, or less than 1 at. %), nitrogen (less than 0.5 at. %), and hydrogen (less than 1.5 at. %) contents may be present in the deposited material. Oxygen may originate from post-deposition oxidation.

In some embodiments, continuous material layers may be observed at different thicknesses. For example, in some embodiments, an approximately 3 nm thick material may form a continuous layer. This may be observed after, for example, 10 deposition cycles. In some embodiments, about 7 nm material may form a continuous layer. This may be observed after, for example, 50 deposition cycles. Cobalt sulfide material according to the current disclosure may also be grown on chemically different substrates, including sapphire, mica, GaN, and different ALD-grown surfaces, such as $Al_2O_3$, Ir, and $TiO_2$.

In contrast to silicon oxide-comprising surfaces, cobalt sulfide deposition may display a clear nucleation delay on Si—H surface. For example, it may take about 250 deposition cycles to obtain a continuous layer.

In certain embodiments, cobalt sulfide layers may be grown to a thickness of approximately 60 nm on a silicon surface at 275 °C were heat treated to test the stability of the deposited material. In a flowing $N_2$ atmosphere having a total pressure of 30 mbar, no changes in crystallinity and phase composition may be observed upon heating to at least 750 °C. Thus, it may be that a $Co_9S_8$-comprising layer deposited according to the methods of the current disclosure may be used as a seed or barrier layer for cobalt or copper deposition, for example, as well as other applications with high-temperature processing. Under dynamic high vacuum (approximately $10^{-5}$ mbar), the $Co_9S_8$-comprising layer may be stable at least to 600 °C. In a reducing forming gas (10% $H_2$/90% $N_2$) environment under atmospheric pressure, the $Co_9S_8$ layers may be stable up to at least approximately 400

°C. At higher temperatures, metallic cobalt may start to form. The layer may be transformed substantially completely to elemental cobalt (mainly fcc Co, with a minor contribution from hcp Co) at about 475 °C. Under ambient (oxidizing) atmosphere, $Co_9S_8$ in the deposited material may remain stable to about 225 °C, and it may start to convert to $Co_3S_4$ at about 250 °C. Formation of $Co_3O_4$ may begin at 275 °C, and the oxide may coexist with various phases during the measurement such as, for example, with $Co_3S_4$ up to about 300 °C, with $Co_3S_4$ and $CoS_2$ at about 325 °C to about 375 °C, and with $CoSO_4$ at about 400 °C to about 550 °C, until $Co_3S_4$ may become the only phase present at about 575 °C to °C 725 °C. Under atmospheric pressure of pure oxygen, the high-temperature behavior may be similar to ambient air, although some of the phase transitions may occur at slightly lower temperatures.

As further examples, nickel sulfide material may be deposited according to the methods presented herein. Many nickel sulfides are highly conductive materials that may be used for applications similar to $CoS_x$. Therefore, $NiCl_2$(TMPDA) (Tsource=157 °C) may be used as a transition metal precursor in deposition with $H_2S$ as the second precursor at temperatures ranging from 165 °C to 250 °C. Pulse time of 2 s for $NiCl_2$(TMPDA) and $H_2S$ may be used. For example, nickel sulfide may be deposited at a temperature of 165 °C at a growth rate of 0.6 Å/cycle, and the obtained nickel sulfide-comprising material may have a resistivity of 40μΩ cm.

At a temperature from about 165 °C to about 175 °C, the nickel sulfide-comprising material may be grown at a rate of, for example, 0.6 Å/cycle, and the resulting material may have a resistivity of about 40μΩ cm for example. A lower growth rate may be observed at a temperature from about 200 °C to about 250 °C while the resistivity of the material may increase to about 100μΩ cm, for example. The sulfur/nickel ratio may remain at approximately 1.0 throughout the temperature range from about 165 °C to about 250 °C. The material may comprise β-NiS and $Ni_9S_8$ phases.

The layers deposited at the lowest temperatures may contain mostly β-NiS, whereas increasing the temperature may increase the amount of the $Ni_9S_8$ phase. Low oxygen (less than 0.5 at. %), carbon (about 0.5 at. % or less), nitrogen (less than 0.5 at. %), and hydrogen (less than 1.5 at. %, or less than 1 at. %) contents may be present in the deposited material. In some embodiments, the total level of O, C, N, and H impurities may be about 2 at. % or less. In some embodiments, the deposited nickel sulfide material may contain no clear surface oxidation even though the material is stored in ambient atmosphere.

$NiS_x$ may be deposited on a range of substrates, including Si, $SiO_2$, SLG, sapphire (α-$Al_2O_3$), mica, and ALD-deposited Ir, $SnS_2$, and TiN as a first surface. However, the nickel sulfide material may not readily grow on Si—H, ALD-grown $Al_2O_3$, ALD-grown $Ta_2O_5$, ALD-grown $ZrO_2$, ALD-grown $Nb_2O_5$, ALD-grown $TiO_2$ or ALD-grown ZnS as the second surface. In some embodiments, it may be possible to grow 50 nm of $NiS_x$ on the first surface, while there is no deposition on the second surface. In some embodiments, there may be deposition of some nanometers, such as 4 or 6 nm on the second surface, while there is about 50 nm of deposited material on the first surface.

In some embodiments, an approximately 6 nm thick layer with a conductivity of 250μΩ cm may be deposited on native oxide-containing silicon oxide with 100 deposition cycles. The resistivity of the layer may decrease with increasing layer thickness. For example, at layer thickness of about 20 nm, the resistivity may be about 60μΩ cm and at a layer thickness of about 45 nm, about 40μΩ cm.

In some embodiments, an approximately 50 nm thick layer deposited at 165 °C may initially comprise predominantly β-NiS with a $Ni_9S_8$ component present. Under a $N_2$ atmosphere at atmospheric pressure, β-NiS phase may be present to a temperature of about 400 °C and $Ni_9S_8$ to about 475 °C. Above this temperature, α-$Ni_7S_6$ may form and may be the substantially only phase at a temperature of about 575 °C and above. NiSi may be formed at temperatures above 600 °C, and without limiting the current disclosure to any specific theory, its presence may be due to a reaction with the substrate. Sulfur may not be completely lost from the nickel sulfide layers, as $Ni_3S_2$ may also be formed and be present when the material is cooled down to room temperature.

In a dynamic high vacuum at approximately $10^{-5}$ mbar, the phase transformations may occur at lower temperatures compared to $N_2$. β-NiS and $Ni_9S_8$ phases may disappear at, for example, about 350 °C and 375 °C, respectively, and α-$Ni_7S_6$ may be observed between about 375 °C and about 475 °C, with NiSi starting to form at about 450 °C. After heating the deposited material to about 750 °C and cooling back to room temperature, $Ni_3S_2$ may be present in addition to NiSi.

In a reducing forming gas (10% $H_2$, 90% $N_2$) environment under atmospheric pressure, β-NiS may start to become reduced at about 300 °C, forming $Ni_9S_8$. Metallic nickel (fcc structure) may start to form at about 350 °C and be present as the only phase from about 425 °C upwards. Thus, $NiS_x$ layers may be more easily reduced to elemental metal than $Co_9S_8$.

In some embodiments, $Ni_9S_8$ may disappear when the temperature reaches about 250 °C, leaving substantially only β-NiS present until 300 °C, where a $Ni_3S_4$ component may start to form. Hexagonal α-NiS may begin to form at 325 °C, and at about 375 °C to 450 °C the layer may mostly comprise α-NiS, although NiO may start to emerge at above about 350 °C in ambient atmosphere. The α-NiS phase may disappear when the temperature reaches about 475 °C and a $NiSO_4$ phase may exist between about 500 °C and about 550 °C. At higher temperatures, following decomposition of $NiSO_4$, sulfur-comprising phases may be absent from the layer. When pure $O_2$ is used instead of ambient atmosphere, similar phase transitions may take place, although at temperatures from about 25 °C to about 50 °C lower compared to ambient atmosphere.

In oxidizing conditions, $NiS_x$ layers may be more stable than $Co_9S_8$, which may start to transform into other sulfide phases at about 275 °C. The threshold temperature for oxide formation may be about 100 °C higher for $NiS_x$ compared to $Co_9S_8$ (375 °C compared to 275 °C).

In another non-limiting example, transition metal selenide and transition metal telluride may be deposited. $CoCl_2$(TMEDA) and $NiCl_2$(TMPDA) may be used together with $Se(SiEt3)_2$ and $Te(SiEt_3)_2$ as second precursors to deposit the respective selenides and tellurides.

$CoCl_2$(TMEDA) could be used to deposit cobalt selenide layer having a Se/Co atomic ratio close to 1.0. At a deposition temperature of 180 °C the layer may have resistivity of approximately 50 μΩcm. If a higher deposition temperature of 225 °C or 275 °C is used, material comprising mainly crystalline $Co_9Se_8$ with some CoSe may be achieved.

$CoCl_2$(TMEDA) and $Te(SiEt_3)_2$ may be used to deposit cobalt telluride material on a substrate at temperatures from about 180 °C to about 275 °C. The material may be crystalline, and it may comprise, for example, hexagonal CoTe phase and possibly $Co_{1.67}Te_2$ phase. The deposited material may have a resistivity of approximately 120 μΩcm.

$NiCl_2$(TMPDA) and $Te(SiEt_3)_2$ may be used to deposit nickel telluride material on a substrate. The deposition temperature may vary from about 165 °C to about 200 °C.

Figure 1B:
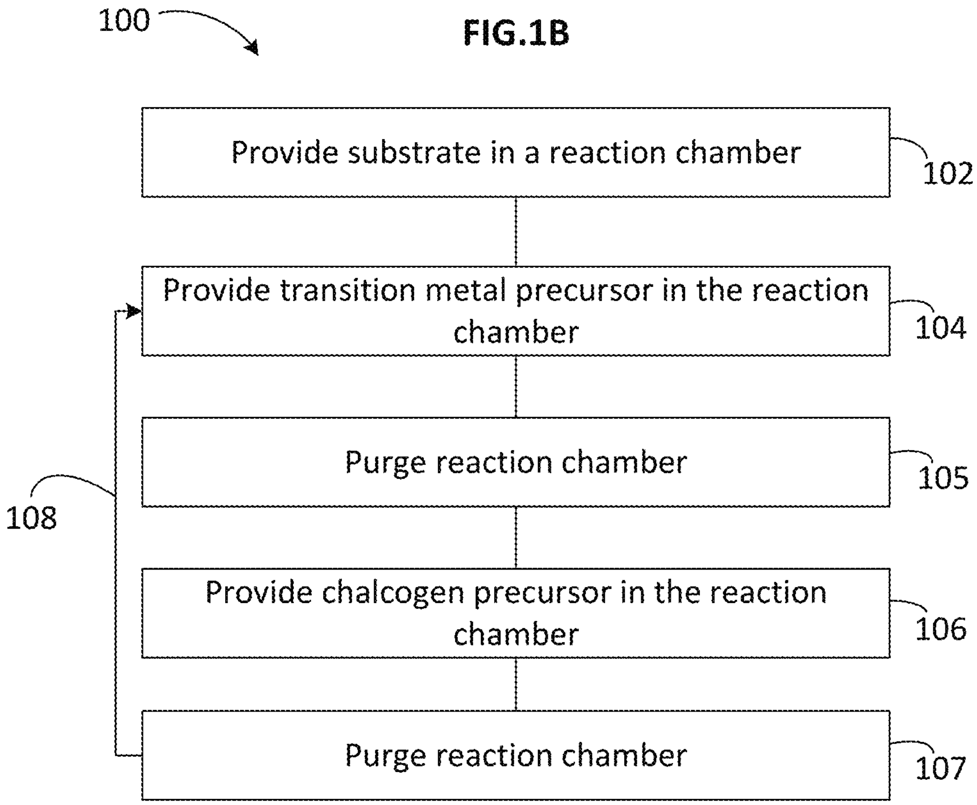

In some embodiments, the cyclical deposition process comprises providing the transition metal precursor and the second precursor alternately and sequentially in the reaction chamber. In some embodiments, the reaction chamber is purged between precursors, 105, 107, as depicted in FIG. 1B. In such embodiments, a deposition cycle may be considered to contain steps 104, 105, 106 and 107. As above, a deposition cycle may be repeated 108 a number of times to achieve desired transition metal-comprising material thickness.

The amount of transition metal-comprising material deposited during one cycle (growth per cycle) varies depending on the process conditions, such as temperature, precursor pulse length and flow speed. Growth per cycle rate may be, for example, from about 0.01 Å/cycle to about 3 Å/cycle, or from about 0.05 Å/cycle to about 2 Å/cycle, 0.1 Å/cycle to about 1.5 Å/cycle, such as from about 0.2 Å/cycle to about 1.2 Å/cycle or from about 0.3 Å/cycle to about 1.5 Å/cycle. For example, the growth rate may be about 0.4 Å/cycle, 0.5 Å/cycle, 0.7 Å/cycle, 0.8 Å/cycle, 1.0 Å/cycle, or 1.1 Å/cycle. Depending on the deposition conditions, deposition cycle numbers etc., transition metal-comprising material layers of variable thickness may be deposited. For example, transition metal-comprising material may have a thickness between approximately 0.2 nm and 90 nm, or between about 1 nm and 50 nm, or between about 0.5 nm and 25 nm, or between about 1 nm and 50 nm, or between about 10 nm and 120 nm. A transition metal-comprising material may have a thickness of, for example, approximately 0.5 nm, 1 nm, 2 nm, 3 nm, 5 nm, 6 nm, 8 nm, 10 nm, 15 nm, 20 nm, 25 nm, 30 nm, 35 nm, 40 nm, 50 nm, 70 nm, 85 nm or 100 nm. The desired thickness may be selected according to the application in question. In some embodiments, thin substantially continuous layers may be deposited by a method according to the current disclosure.

In certain applications, thin, substantially continuous layers are desired. In some embodiments, the transition metal-comprising material forms a substantially continuous layer at a thickness of 10 nm or below. In some embodiments, the transition metal-comprising material forms a continuous layer at a thickness of 10 nm or below. In some embodiments, a substantially continuous layer may be formed at around 10 deposition cycles. In some embodiments, a substantially continuous layer may be formed at a thickness of less than 5 nm. For example, a substantially continuous cobalt sulfide layer maybe formed at a thickness of less than 4 nm.

Transition metal precursor and second precursor may be provided in the reaction chamber in separate steps (104 and 106). FIG. 1B illustrates an embodiment according to the current disclosure, where steps 104 and 106 are separate by purge steps 105 and 107. In such embodiments, a deposition cycle comprises one or more purge steps 103, 105. During purge steps, precursor and/or reactant can be temporally separated from each other by inert gases, such as argon (Ar), nitrogen ($N_2$) or helium (He) and/or a vacuum pressure. The separation of transition metal precursor and second precursor may alternatively be spatial.

Purging the reaction chamber 103, 105 may prevent or mitigate gas-phase reactions between a transition metal precursor and a second precursor, and enable possible self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a transition metal precursor and a second precursor. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

When performing the method 100, transition metal-comprising material is deposited onto the substrate. The deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a transition metal precursor and a second precursor. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reactant or precursor and the periodic pulsing of the other chemical component into the reaction chamber. The temperature and/or pressure within a reaction chamber during step 104 can be the same or similar to any of the pressures and temperatures noted above in connection with step 102.

In some embodiments, the transition metal precursor is brought into contact with a substrate surface 104, excess transition metal precursor is partially or substantially completely removed by an inert gas or vacuum 105, and second precursor is brought into contact with the substrate surface comprising transition metal precursor. Transition metal precursor may be brought in to contact with the substrate surface in one or more pulses 104. In other words, pulsing of the transition metal precursor 104 may be repeated. The transition metal precursor on the substrate surface may react with the second precursor to form transition metal-comprising material on the substrate surface. Also pulsing of the second precursor 106 may be repeated. In some embodiments, second precursor may be provided in the reaction chamber first 106. Thereafter, the reaction chamber may be purged 105 and transition metal precursor provided in the reaction chamber in one or more pulses 104.

The applicability of a material may depend on its electrical properties, such as resistivity. In some embodiments, transition metal-comprising material layer according to the current disclosure may have a resistivity of less than 200μΩ cm. For example, the resistivity of a transition metal-comprising material layer according to the current disclosure may be less than 150μΩ cm, less than 100μΩ cm, or less than 70μΩ cm, or less than less than 50μΩ cm. The thickness of a layer with said resistivity may be, for example, about 20 nm, about 30 nm, about 40 nm, about 50 nm or about 80 nm. For example, if cobalt sulfide is deposited by using $CoCl_2$ (TMEDA) and $H_2S$, resistivity of less than 100μΩ cm may be achieved for a transition metal chalcogenide-comprising layer. The thickness of such layer may be from about 40 nm to about 70 nm. The transition metal-comprising material may comprise, consist essentially of, or consist of $Co_9S_8$. As another non-limiting example, if nickel sulfide is deposited by using $NiCl_2$(TMPDA) and $H_2S$, resistivity of less than 50μΩ cm may be achieved for a transition metal chalcogenide-comprising layer. The thickness of such layer may be from about 25 nm to about 60 nm. The transition metal-comprising material may comprise, consist essentially of, or consist of β-NiS and/or $Ni_9S_8$. In some embodiments, the resistivity of the transition metal chalcogenide-comprising layer may depend on the deposition temperature. In certain cases, lower resistivity may be achieved with a lower deposition temperature. In some other case, the effect is reversed, and the resistivity increases with lowering deposition temperature. In some embodiments, the electrical resistivity of a transition metal chalcogenide-comprising layer according to the current disclosure is less than 100μΩ cm at a layer thickness of 50 nm. In some embodiments, the electrical resistivity of a nickel sulfide-comprising layer according to the current disclosure is less than 100μΩ cm at a layer thickness of 20 nm. In some embodiments, the electrical resistivity of a nickel sulfide-comprising layer according to the current disclosure is less than 50μΩ cm at a layer thickness of 50 nm.

Additional treatment steps, such as reduction or annealing may be performed on the transition metal-comprising material after deposition. For example, in some embodiments, an anneal may be performed to convert the transition metal chalcogenide into a desired phase. For example, annealing a nickel sulfide layer at a temperature from about 400 °C to about 500 °C may allow obtaining layers comprising substantially only $Ni_9S_8$ and/or α-$Ni_7S_6$. In some embodiments, transition metal chalcogenide-comprising layers according to the current disclosure, such as cobalt sulfide layers, may be stable in high temperatures. In some embodiments, a transition metal-comprising material according to the current disclosure may be used as a seed layer for cobalt or copper. In some embodiments, a transition metal-comprising material according to the current disclosure may be used as a barrier layer for cobalt or copper. Generally, a transition metal-comprising material deposited by methods according to the current disclosure may be usable in high thermal budget applications.

Figure 2:
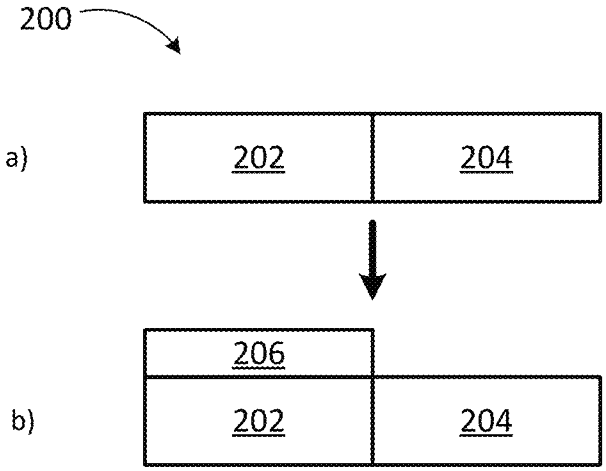
FIG. 2 illustrates an exemplary embodiment of a method of selectively depositing a transition metal-comprising material on a substrate according to the current disclosure.

FIG. 2 is a schematic representation of a selective embodiment of the current disclosure. The substrate 200 provided during step 102 may include a first surface 202 comprising a first material and a second surface 204 comprising a second material. In the exemplary embodiment of FIG. 2, a substrate 200 comprising a first surface 202 having a first material and a second surface 204 comprising a second material is depicted. The substrate 200 may comprise additional layers below the surface. In panel a), the surface of the substrate is formed by the first surface 202 and second surface 204. The first surface 202 comprises, consist essentially of, or consist of first material. The second surface 204 comprises, consist essentially of, or consist of second material. First material and second material are different materials. In the illustration of FIG. 2, the first surface 202 and the second surface 204 are on the same vertical level. However, in reality, the first and second surfaces 202, 204 could be on different levels.

In panel b) of FIG. 2, transition metal-comprising material 206 according to the current disclosure has been selectively deposited on the first surface 202. The deposition of transition metal-comprising material 206 may be done in one or more deposition cycles.

In some embodiments, the first material comprises a first dielectric material. In some embodiments, the first material comprises a first metal. In some embodiments, the second material comprises a second dielectric material. The second dielectric material is different from the first dielectric material. In some embodiments, the second material comprises a second metal. The second metal is different from the first metal. Thus, in some embodiments, the first material comprises a first dielectric material or a first metal, and the second material comprises a second dielectric material or a second metal. In some embodiments, the first surface 202 consists essentially of, or consists of first material. In some embodiments, the second surface 204 consists essentially of, or consists of second material.

In some embodiments, the first material comprises native silicon oxide, thermal silicon oxide, soda lime glass, a metal, such as iridium, a metal sulfide, such as tin sulfide or a metal nitride, such as titanium nitride. In some embodiments, the first surface may comprise ruthenium (Ru), rhodium (Rh), osmium (Os), palladium (Pd), platinum (Pt) or gold (Au).

In some embodiments, the second material comprises Si—H, metal oxide, such as aluminum oxide, tantalum oxide, zirconium oxide, niobium oxide or titanium oxide, metal sulfide, such as zinc sulfide. In some embodiments, the second material is in situ-deposited material. By in situ-deposited material is herein meant material that has not been exposed to other atmospheres than the atmosphere in which it has been deposited. For example, in situ-deposited material has not been exposed to ambient atmosphere. As another example, in situ-deposited material has been maintained under nitrogen atmosphere. In an embodiment, the second material is in situ-deposited aluminum oxide ($Al_2O_3$).

Figure 3:
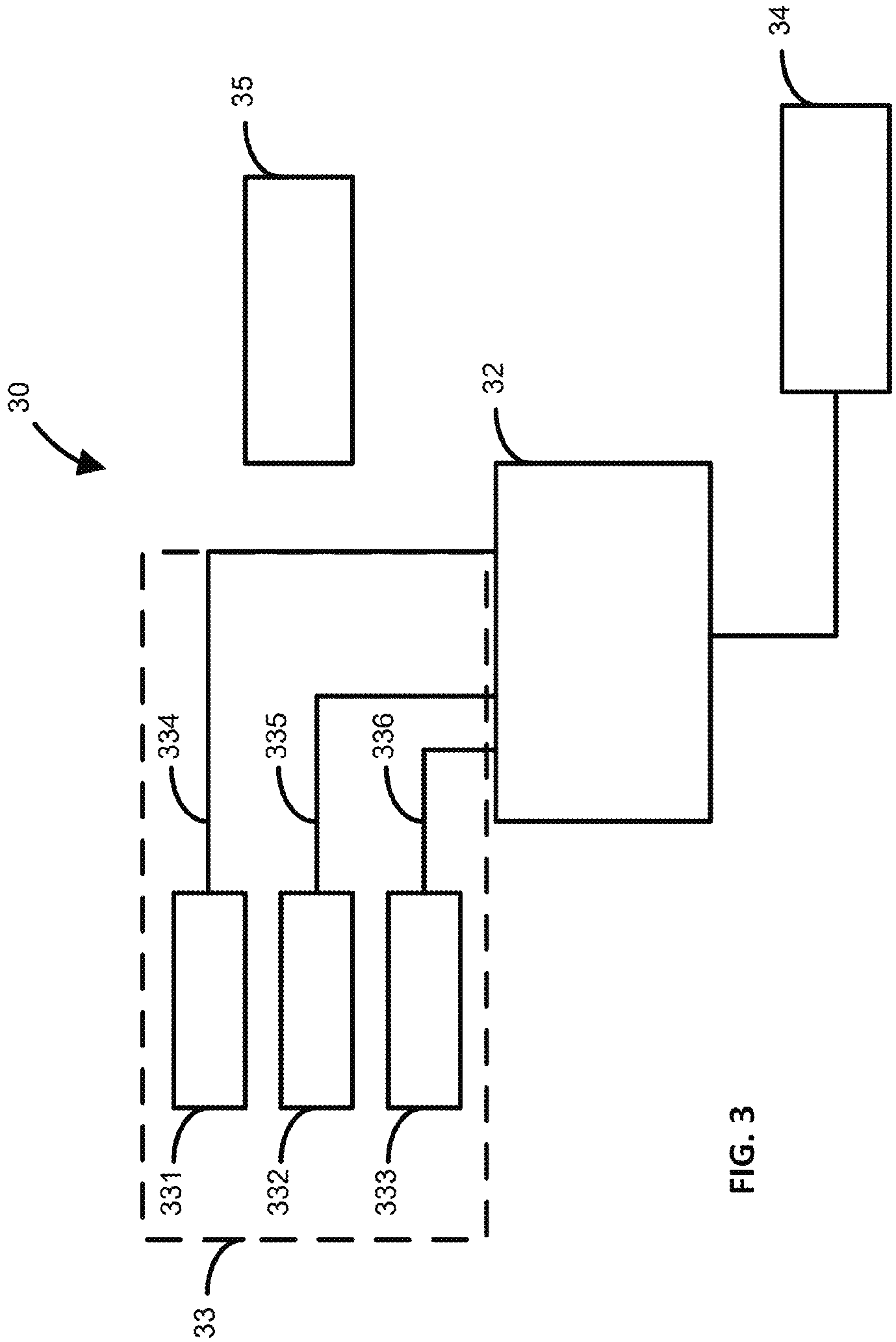
FIG. 3 is a schematic presentation of a vapor deposition assembly according to the current disclosure.

FIG. 3 is a schematic presentation of an embodiment of a vapor deposition assembly 30 according to the current disclosure for depositing transition metal-comprising material on a substrate.

The deposition assembly 30 can be used to perform a method according to the current disclosure and/or form a structure or device portion according to the current disclosure. In the illustrated example, deposition assembly 30 includes one or more reaction chambers 32 constructed and arranged to hold the substrate, and a precursor injector system 33 constructed and arranged to provide a transition metal precursor and/or a second precursor into the reaction chamber 32. The reaction chamber 32 can comprise any suitable reaction chamber, such as an ALD or CVD reaction chamber. The deposition assembly 30 may comprise a heater constructed and arranged to control the temperature in the reaction chamber between 50 °C to about 350 °C.

The deposition assembly further includes a precursor vessel 331 constructed and arranged to contain and evaporate a transition metal precursor ADD FEATURES. The deposition assembly 400 is constructed and arranged to provide the precursor via the precursor injector system 401 to the reaction chamber 402 to deposit the silicon oxide on the substrate according to the current disclosure.

The precursor injector system 33 of the deposition assembly 30 further comprises a second precursor source 332, an optional purge gas source 333, an exhaust source 34, and a controller 35. The transition metal precursor source 331 can include a vessel and one or more transition metal precursors as described in the current disclosure—alone or mixed with one or more carrier (e.g., inert) gases. Second precursor source 332 can include a vessel and one or more second precursors according to the current disclosure—alone or mixed with one or more carrier gases. One or both vessels may comprise a vaporizer constructed and arranged to evaporate a transition metal precursor or a second precursor, respectively, according to the current disclosure. The vaporizers may be constructed and arranged to vaporize the transition metal precursor or the second precursor, respectively, at a suitable temperature. The suitable temperature for the transition metal precursor may be, for example, from 50 °C to 350 °C. Purge gas source 333 can include one or more inert gases as described herein. Although illustrated with three gas sources 331-333, deposition assembly 30 can include any suitable number of gas sources. Gas sources 331-333 can be coupled to reaction chamber 32 via lines 334-336, which can each include flow controllers, valves, heaters, and the like. The deposition apparatus 30 may contain a pump constructed and arranged to pump down the pressure in the reaction chamber 30. The pump may be comprised in the exhaust source 34. The exhaust source 34 may comprise one or more vacuum pumps.

Controller 35 includes electronic circuitry and software to operate valves, manifolds, heaters, pumps and other components included in the deposition assembly 30. Such circuitry and components operate to introduce one or more precursors, reactants, and purge gases from the respective sources 331-333. Controller 35 can control timing of gas pulse sequences, temperature of the substrate and/or reaction chamber, pressure within the reaction chamber, and various other operations to provide proper operation of the deposition assembly 30. Controller 35 can include control software to electrically or pneumatically control valves to control flow of precursors, reactants and purge gases into and out of the reaction chamber 32. Controller 35 can include modules such as a software or hardware component, which performs certain tasks. A module can advantageously be configured to reside on the addressable storage medium of the control system and be configured to execute one or more processes.

Other configurations of deposition assembly 30 are possible, including different numbers and kinds of precursor sources and purge gas sources. Further, it will be appreciated that there are many arrangements of valves, conduits, precursor sources, and purge gas sources that may be used to accomplish the goal of appropriately feeding gases into reaction chamber 32. Further, as a schematic representation of an assembly, many components have been omitted for simplicity of illustration, and such components may include, for example, various valves, manifolds, purifiers, heaters, containers, vents, and/or bypasses, as well as safety features.

During operation of deposition assembly 30, substrates, such as semiconductor wafers (not illustrated), are transferred from, e.g., a substrate handling system to reaction chamber 32. Once substrate(s) are transferred to reaction chamber 32, one or more gases from gas sources 331-333, such as precursors, carrier gases, and/or purge gases, are introduced into reaction chamber 32.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a transition metal comprising material on a substrate by a cyclic deposition process, the method comprising:

providing a substrate in a reaction chamber;

providing a transition metal precursor comprising a transition metal compound in the reaction chamber; and providing a second precursor in the reaction chamber, wherein the transition metal compound comprises a transition metal and one or more adduct forming ligands, wherein the substrate comprises a first surface comprising a first material and a second surface comprising a second material, wherein the transition metal-comprising material is selectively deposited on the first surface relative to the second surface, and wherein the second precursor comprises radicals comprising tellurium, arsenic or bismuth.

2. The method of claim 1, wherein at least one adduct ligand of the one or more adduct forming ligands is a bidentate nitrogen-comprising adduct ligand.

3. The method of claim 2, wherein the bidentate nitrogen-comprising adduct ligand comprises two nitrogen atoms, each of nitrogen atoms bonded to at least one carbon atom.

4. The method of claim 1, wherein the transition metal is heteroleptic transition metal precursor.

5. The method of claim 1, wherein the transition metal is selected from a group consisting of Co and Ni.

6. The method of claim 1, wherein at least one adduct ligand of the one or more adduct forming ligands is a cyclic adduct ligand.

7. The method of claim 1, wherein the transition metal compound comprises a halide.

8. The method of claim 1, wherein at least one adduct ligand of the one or more adduct forming ligands coordinates to a transition metal atom, of the transition metal compound, through at least one of a nitrogen atom, a phosphorous atom, an oxygen atom, or a sulfur atom.

9. The method of claim 8, wherein the second precursor is formed from a compound selected from the group consisting of $H_2Te$, $(CH_3)_2Te$ and $Te(SiEt_3)_2$.

10. The method of claim 1, wherein the second precursor is formed from arsenic.

11. The method of claim 1, wherein the second precursor comprises an alkyl group.

12. The method of claim 1, wherein the cyclical deposition process comprises providing the transition metal precursor and the second precursor alternately and sequentially in the reaction chamber, and wherein a temperature is less than 250 °C.

13. The method of claim 1, wherein the first material comprises a first dielectric material or a first metal, and the second material comprises a second dielectric material or a second metal.

14. The method of claim 13, wherein the first material comprises native silicon oxide, thermal silicon oxide, soda lime glass, a metal, a metal sulfide, or a metal nitride.

15. The method of claim 1, wherein the second material comprises Si—H, a metal oxide, or a metal sulfide.

16. A method of forming a transition metal comprising material on a substrate by a cyclic deposition process, the method comprising:

providing a substrate in a reaction chamber;

providing a transition metal precursor comprising a transition metal compound in the reaction chamber; and providing a second precursor in the reaction chamber, wherein the transition metal compound comprises a transition metal and one or more adduct forming ligands, wherein the second precursor comprises radicals comprising tellurium, arsenic or bismuth, and wherein the transition metal precursor is selected from a group consisting of $Co(btsa)_2(THF)$-comprising transition metal precursor, $Ni(btsa)_2(THF)$-comprising transition metal precursor.

17. A method of forming a transition metal comprising material on a substrate by a cyclic deposition process, the method comprising:

providing a substrate in a reaction chamber;

providing a transition metal precursor comprising a transition metal compound in the reaction chamber; and providing a second precursor in the reaction chamber, wherein the transition metal compound comprises a transition metal and one or more adduct forming ligands, wherein the second precursor comprises radicals comprising tellurium, arsenic or bismuth, and wherein the transition metal precursor comprises a heteroleptic transition metal precursor comprising a tetrahydrofuran (THF) ring attached to a transition metal atom.

18. The method of claim 17, wherein the heteroleptic transition metal precursor comprises two bis(trimethylsilyl) amide ligands attached to the transition metal atom through nitrogen atoms.

19. A method of forming a transition metal-comprising material on a substrate by a cyclic deposition process, the method comprising:

providing a substrate in a reaction chamber;

providing a transition metal precursor comprising a transition metal and one or more adduct forming ligands in the reaction chamber;

providing a second precursor in the reaction chamber; and contacting the transition metal-comprising material with a reducing agent thereby forming an elemental transition metal, wherein the second precursor comprises radicals comprising tellurium, arsenic or bismuth, and wherein the substrate comprises a first surface comprising a first material and a second surface comprising a second material, wherein the transition metal-comprising material is selectively deposited on the first surface relative to the second surface.

* * * * *